United States Patent
Van der Wagt et al.

[11] Patent Number: 6,150,242
[45] Date of Patent: Nov. 21, 2000

[54] METHOD OF GROWING CRYSTALLINE SILICON OVERLAYERS ON THIN AMORPHOUS SILICON OXIDE LAYERS AND FORMING BY METHOD A RESONANT TUNNELING DIODE

[75] Inventors: Jan Paul Van der Wagt, Newbury Park, Calif.; Glen D. Wilk, Dallas; Robert M. Wallace, Richardson, both of Tex.

[73] Assignee: Texas Instruments Incorporated, Dallas, Tex.

[21] Appl. No.: 09/275,706

[22] Filed: Mar. 25, 1999

Related U.S. Application Data

[60] Provisional application No. 60/079,253, Mar. 25, 1998.

[51] Int. Cl.$^7$ ...................................................... H01L 21/20
[52] U.S. Cl. .............................................. 438/481; 257/25
[58] Field of Search .................................. 438/480, 481, 438/492, 503, 504, 507; 257/25

[56] References Cited

U.S. PATENT DOCUMENTS

| | | | |
|---|---|---|---|
| 5,422,305 | 6/1995 | Seabaugh et al. | 438/480 |
| 5,606,177 | 2/1997 | Wallace et al. | 257/25 |

*Primary Examiner*—Charles Bowers
*Assistant Examiner*—Keith Christianson
*Attorney, Agent, or Firm*—Wade James Brady, III; Frederick J. Telecky, Jr.

[57] ABSTRACT

A method of forming a layer of crystalline silicon over silicon oxide and a resonant tunnel diode wherein there is provided a sufficiently clean (surface impurities<$10^{13}$/cm$^2$), atomically smooth (rms roughness<3 Angstroms) crystalline silicon surface. Spaced apart regions of silicon oxide are formed on the surface sufficiently thin so that deposited silicon over the surface and silicon oxide will be capable of using the surface as a seed to form crystalline silicon with deposited silicon extending over the silicon oxide. The silicon is then deposited over the surface including the silicon oxide to provide the crystalline silicon over silicon oxide. The resonant tunnel diode is formed by forming a layer of silicon oxide over the deposited silicon, forming an electrically conductive layer over the layer of silicon oxide and removing the portions of the electrically conductive layer, the layer of silicon oxide and the deposited silicon from the interstices between the spaced apart regions of silicon oxide. The spaced apart regions of silicon oxide have a thickness of from about 10 to about 40 Angstroms and preferably about 15 Angstroms. The step of forming spaced apart regions comprises forming a layer of silicon oxide over surface, patterning the silicon oxide with a resist and etching the silicon oxide in patterned regions, leaving some silicon oxide. The resist is then removed and the remainder of the silicon oxide in the patterned region is removed down to the surface while concurrently removing a portion of the silicon oxide in the unpatterned region.

12 Claims, 1 Drawing Sheet

METHOD OF GROWING CRYSTALLINE SILICON OVERLAYERS ON THIN AMORPHOUS SILICON OXIDE LAYERS AND FORMING BY METHOD A RESONANT TUNNELING DIODE

This application claims priority under 35 USC 119(e)(1) of provisional application Ser. No. 60/079,253 filed Mar. 25, 1998.

BACKGROUND OF THE INVENTION

1. Field of the Invention

This invention relates to a method of growing crystalline silicon over thin layer of amorphous silicon dioxide, primarily but not limited to use in fabrication of resonant tunneling diodes.

2. Brief Description of the Prior Art

It has long been the desire in the art to fabricate a structure in silicon commencing with a crystalline silicon substrate with consecutive thin layers thereover of silicon dioxide followed by a layer of crystalline silicon and then a further layer of silicon dioxide with a conductor over the further layer of silicon dioxide. While structures of this type have been available in group III–V materials, particularly gallium arsenide, these structures have not been available in silicon since crystalline silicon has generally not been capable of fabrication over silicon dioxide. Although silicon-on-insulator (SOI) technology uses crystalline silicon on silicon dioxide, the layer thicknesses in SOI are on the order of thousands of Angstroms, whereas, for resonant tunneling diodes (RTDs), the layer thicknesses are on the order of tens of Angstroms.

SUMMARY OF THE INVENTION

In accordance with the present invention, there is developed a procedure whereby crystalline silicon can be formed over a thin silicon dioxide layer.

Briefly, thin silicon dioxide pads are formed and patterned on a silicon substrate with the bare silicon being exposed between the silicon dioxide pads. The bare silicon serves as an epitaxial seed for crystalline lateral overgrowth of the epitaxially deposited silicon over the silicon dioxide-containing regions on the silicon substrate. By forming very thin silicon dioxide layers, the term "thin" being defined herein as from about 10 Angstroms to about 30 Angstroms, the structures fabricated can be used for resonant tunneling diodes on silicon. The temperatures required for large silicon surface diffusion lengths will maintain the silicon dioxide regions intact while forming crystalline silicon regions thereon. With thin silicon overgrowth over the silicon dioxide regions, such overgrowth being from about 10 Angstroms to about 50 Angstroms in thickness, these layers of silicon serve as quantum wells for resonant tunneling to occur. Once this structure is achieved, formation of a second insulating barrier is achieved by any one of many standard known routes.

The procedure for fabrication of a resonant tunneling diode in silicon in accordance with the present invention is to start with a sufficiently clean (surface impurities<$10^{13}$/cm$^2$) and smooth (rms roughness<3 Angstroms) crystalline silicon, preferably but not limited to Si(100), surface and form thereon a layer of silicon dioxide of from about 50 Angstroms to about 100 Angstroms and preferably about 80 Angstroms in thickness. A layer of photoresist is formed over the silicon dioxide, patterned and etched with small regions of silicon dioxide remaining unetched or substantially unetched and the remainder of the silicon dioxide which separates these region being thinned to a thickness of from about 10 Angstroms to about 20 Angstroms. The reasons for not etching down to the bare silicon substrate at this time is so that contaminants from the photoresist and etching process to this point can now be cleaned away and kept away from the crystalline silicon surface. The remaining photoresist is then removed and the remaining silicon dioxide between the small regions is removed, such as, for example, with HF with the thickness of the small regions now being narrowed to from about 10 Angstroms to about 40 Angstroms and preferably about 15 Angstroms and being hydrogen terminated to expose the bare silicon between the silicon dioxide regions and leave a clean and inert silicon surface exposed. The small silicon dioxide regions will preferably have essentially the cross sectional dimensions of the final device being fabricated. Silicon is then epitaxially deposited over the entire surface such as, for example, by MBE, CVD, etc., with the regions of exposed silicon substrate acting as a seed for forming crystalline silicon and extending the crystalline silicon formation over the silicon dioxide regions to form a layer of crystalline silicon over the silicon dioxide regions. This layer is from about 10 Angstroms to about 40 Angstroms and preferably about 20 Angstroms. A layer of silicon dioxide is then formed over the silicon layer, for example, by oxidation, of from about 10 Angstroms to about 40 Angstroms and preferably about 15 Angstroms. An electrically conductive and essentially planar layer is then formed over the entire surface, preferably about 2000 Angstroms, though this thickness has no criticality above about 1000 Angstroms. The entire structure is then patterned and selectively etched in the regions surrounding the silicon dioxide regions to provide plural resonant tunneling diodes which can be separated from the substrate by appropriate well known procedures.

DESCRIPTION OF THE PREFERRED EMBODIMENT

Figure 1A:
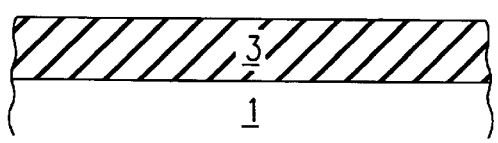
FIGS. 1a to 1i provide a process flow for fabrication of a resonant tunneling diode in accordance with the present invention.
Figure 1B:
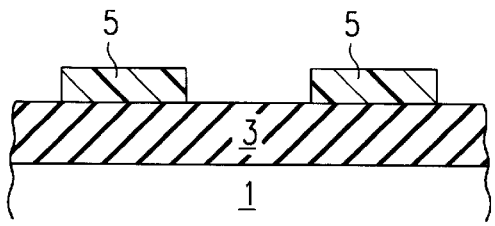
Figure 1C:
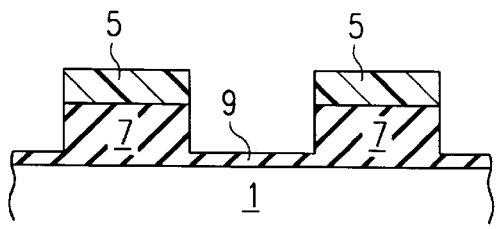
Figure 1D:
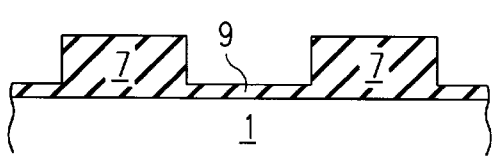
Figure 1E:
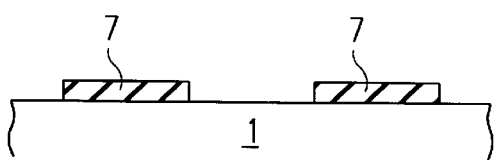
Figure 1F:
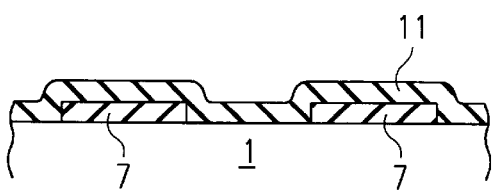
Figure 1G:
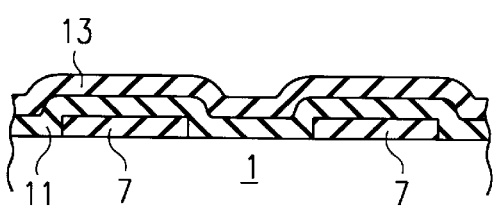
Figure 1H:
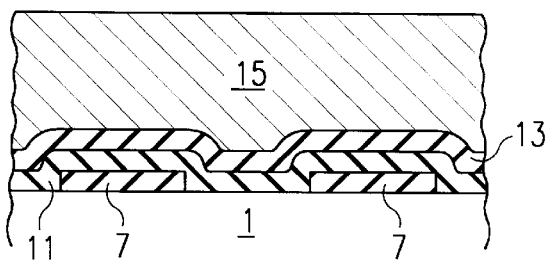
Figure 1I:
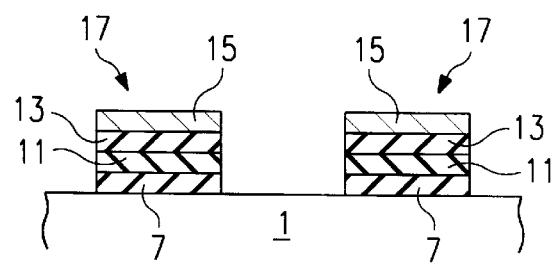

The procedure for fabrication of a resonant tunneling diode in silicon in accordance with the present invention, as shown in FIG. 1a, is to start with a clean (surface impurities<$10^{13}$/cm$^2$) and smooth (rms roughness<3 Angstroms) crystalline silicon (100) surface, preferably the surface of a substrate 1 and form thereon a layer of silicon dioxide 3 having a thickness of about 80 Angstroms. A layer of photoresist 5 is formed over the silicon dioxide and patterned as shown in FIG. 1b with etching of the silicon dioxide then taking place in the unpatterned regions, leaving the small regions of silicon dioxide 7 under the photoresist remaining unetched or substantially unetched and the remainder of the silicon dioxide 9 which separates these regions being thinned to a thickness of from about 10 Angstroms to about 20 Angstroms as shown in FIG. 1c. The reason for not etching the silicon dioxide 9 down to the bare silicon substrate 1 at this time is so that contaminants from the photoresist and etching process to this point can now be cleaned away and kept away from the crystalline silicon surface to avoid contamination thereof The remaining photoresist is then removed as shown in FIG. 1d and the remaining silicon dioxide 9 between the small regions 7 is removed, such as, for example, with HF with the thickness of the regions 7 now being narrowed to about 15 Angstroms, while the regions of silicon 1 between the silicon dioxide regions 7 are hydrogen terminated as shown in FIG. 1e. This leaves a clean and inert silicon surface 1 exposed. The small silicon dioxide regions 7 will preferably have essentially the cross sectional dimensions of the final device being fabricated. After the samples are placed in a silicon deposition chamber, the hydrogen atoms bonded to the silicon surface 1 (which forms the hydrogen-terminated surface) are removed by heating by heating the substrate to about 600° C. This leaves a reactive, exposed silicon surface in regions 1, and silicon is then epitaxially deposited over the entire surface such as, for example, by MBE or CVD as shown in FIG. 1f with the crystalline silicon 1 acting as a seed to form crystalline silicon 11, which extends over the silicon dioxide regions 7 to form a layer of crystalline silicon over the silicon dioxide regions. This layer 11 is about 35 Angstroms. A layer of silicon dioxide 13 is then formed over the crystalline silicon layer 11 by oxidation of about 15 Angstroms as shown in FIG. 1g. An electrically conductive and essentially planar layer 15 is then formed over the entire surface, preferably about 2000 Angstroms, though this thickness has no criticality above about 1000 Angstroms as shown in FIG. 1h. The entire structure is then patterned and selectively etched in the regions surrounding the silicon dioxide regions to provide plural resonant tunneling diodes 17 which can be separated from the substrate by appropriate well known procedures as shown in FIG. 1i.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of forming a layer of crystalline silicon over silicon oxide which comprises the steps of:
   (a) providing a clean and atomically smooth crystalline silicon surface having surface impurities $<10^{13}/cm^2$ and <3 Angstoms rms roughness;
   (b) forming spaced apart regions of silicon oxide on said surface sufficiently thin so that deposited silicon over said surface and said silicon oxide will be capable of using said surface as a seed to form crystalline silicon with deposited silicon extending over said silicon oxide; and
   (c) depositing said silicon.

2. The method of claim 1 wherein said regions of silicon oxide have a thickness of from about 10 to about 40 Angstroms.

3. The method of claim 1 wherein said regions of silicon oxide have a thickness of about 15 Angstroms.

4. The method of claim 1 wherein said step of forming spaced apart regions comprises the steps of:
   (d) forming a layer of silicon oxide over said surface;
   (e) patterning said silicon oxide with a resist and etching said silicon oxide in patterned regions leaving some silicon oxide;
   (f) removing said resist; and
   (g) removing the remainder of said silicon oxide in said patterned region down to said surface while concurrently removing a portion of said silicon oxide in the unpatterned region.

5. The method of claim 2 wherein said step of forming spaced apart regions comprises the steps of:
   (d) forming a layer of silicon oxide over said surface;
   (e) patterning said silicon oxide with a resist and etching said silicon oxide in patterned regions leaving some silicon oxide;
   (f) removing said resist; and
   (g) removing the remainder of said silicon oxide in said patterned region down to said surface while concurrently removing a portion of said silicon oxide in the unpatterned region.

6. The method of claim 3 wherein said step of forming spaced apart regions comprises the steps of:
   (d) forming a layer of silicon oxide over said surface;
   (e) patterning said silicon oxide with a resist and etching said silicon oxide in patterned regions leaving some silicon oxide;
   (f) removing said resist; and
   (g) removing the remainder of said silicon oxide in said patterned region down to said surface while concurrently removing a portion of said silicon oxide in the unpatterned region.

7. A method of forming a resonant tunnel diode which comprises the steps of:
   (a) providing a crystalline silicon surface;
   (b) forming spaced apart regions of silicon oxide on said surface sufficiently thin so that deposited silicon over said surface and said silicon oxide will be capable of using said surface as a seed to form crystalline silicon with deposited silicon extending over said silicon oxide;
   (c) depositing said silicon over said surface including said silicon oxide,
   (d) forming a layer of silicon oxide over said deposited silicon;
   (e) forming an electrically conductive layer over said layer of silicon oxide; and
   (f) removing the portions of said electrically conductive layer, said layer of silicon oxide and said deposited silicon from the interstices between said spaced apart regions of silicon oxide.

8. The method of claim 7 wherein said spaced apart regions of silicon oxide have a thickness of from about 10 to about 40 Angstroms.

9. The method of claim 7 wherein said regions of silicon oxide have a thickness of about 15 Angstroms.

10. The method of claim 7 wherein said step of forming spaced apart regions comprises the steps of:
    (g) forming a layer of silicon oxide over said surface;
    (h) patterning said silicon oxide with a resist and etching said silicon oxide in patterned regions leaving some silicon oxide;
    (i) removing said resist; and
    (j) removing the remainder of said silicon oxide in said patterned region down to said surface while concurrently removing a portion of said silicon oxide in the unpatterned region.

11. The method of claim 9 wherein said step of forming spaced apart regions comprises the steps of:
    (g) forming a layer of silicon oxide over said surface;

(h) patterning said silicon oxide with a resist and etching said silicon oxide in patterned regions leaving some silicon oxide;

(i) removing said resist; and (j) removing the remainder of said silicon oxide in said patterned region down to said surface while concurrently removing a portion of said silicon oxide in the unpatterned region.

12. The method of claim 9 wherein said step of forming spaced apart regions comprises the steps of:

(g) forming a layer of silicon oxide over said surface;

(h) patterning said silicon oxide with a resist and etching said silicon oxide in patterned regions leaving some silicon oxide;

(i) removing said resist; and (j) removing the remainder of said silicon oxide in said patterned region down to said surface while concurrently removing a portion of said silicon oxide in the unpatterned region.

* * * * *